United States Patent
Eibl

(10) Patent No.: US 7,423,881 B2
(45) Date of Patent: Sep. 9, 2008

(54) ARRANGEMENT AND METHOD FOR COOLING A POWER SEMICONDUCTOR

(75) Inventor: Martin Eibl, Reithofen (DE)

(73) Assignee: Oce Printing Systems GmbH, Poing (DE)

( * ) Notice: Subject to any disclaimer, the term of this patent is extended or adjusted under 35 U.S.C. 154(b) by 163 days.

(21) Appl. No.: 11/358,514

(22) Filed: Feb. 21, 2006

(65) Prior Publication Data

US 2006/0187695 A1    Aug. 24, 2006

(30) Foreign Application Priority Data

Feb. 24, 2005   (DE) .................. 10 2005 008 521

(51) Int. Cl.
  H05K 7/20    (2006.01)
  F28F 7/00    (2006.01)
  H01L 23/34   (2006.01)
(52) U.S. Cl. .................. 361/719; 165/80.2; 165/80.3; 165/185; 361/704; 361/760; 257/713
(58) Field of Classification Search ............ None
  See application file for complete search history.

(56) References Cited

U.S. PATENT DOCUMENTS 5,019,941 A * 5/1991 Craft .................. 361/704
5,973,923 A * 10/1999 Jitaru .................. 361/704
6,002,318 A   12/1999 Werner et al.
6,222,733 B1   4/2001 Grammenthaler
6,366,486 B1 * 4/2002 Chen et al. ............. 363/141
6,469,895 B1 * 10/2002 Smith et al. ............ 361/704
6,518,868 B1   2/2003 Miller et al.
7,061,361 B2 * 6/2006 Koizumi et al. ......... 336/200
2005/0270745 A1* 12/2005 Chen et al. ............. 361/707
2006/0002092 A1*  1/2006 Stevens ................. 361/719

FOREIGN PATENT DOCUMENTS

| DE | 196 37 211 | 6/1999 |
| DE | 198 08 592 | 8/2002 |
| DE | 103 32 842 | 2/2005 |
| JP | 2000-299524 | 10/2000 |
| JP | 2002-222720 | 8/2002 |
| WO | WO 99/07197 | 2/1999 |
| WO | WO 01/20955 | 3/2001 |

* cited by examiner

Primary Examiner—Gregory D Thompson
(74) Attorney, Agent, or Firm—Schiff Hardin LLP

(57) ABSTRACT

In an arrangement and a method for cooling a power semiconductor in which at least one power semiconductor is electrically and thermally conductively connected to at least one passive electric component. Further, a cooling element is thermally conductively connected to at least a part of the surface of the passive electrical component and/or the electrically and thermally conductive connection.

19 Claims, 4 Drawing Sheets

ARRANGEMENT AND METHOD FOR COOLING A POWER SEMICONDUCTOR

BACKGROUND

The preferred embodiment relates to an arrangement and a method for cooling a power semiconductor, in which at least one electrical terminal of the power semiconductor is electrically conductively connected to the electrical terminal of a passive component.

Known circuits comprising power semiconductors are often implemented with the aid of printed circuits in which power semiconductors of the SMD type are used. The heat generated as a result of power loss when a current flows through the power semiconductor has to be dissipated in order to prevent that an allowable temperature limit is exceeded and that the power semiconductor is thus destroyed. In particular in the case of surface mount power semiconductors, the mounting of cooling elements is relatively complex. Further, surface mount power semiconductors have a low height, as a result of which cooling elements, such as heat sinks, mounted on the power semiconductor are likewise arranged at a short distance to a printed circuit. This short distance has the effect that air flowing around such a cooling element is impeded by components arranged next to the power semiconductor on the printed circuit.

Further, arrangements for cooling a power semiconductor are feasible, in which conductive areas of the printed circuit are formed and utilized as cooling surfaces for dissipating heat. However, here too, there is the problem that components arranged on the printed circuit impede the circulation of air required for dissipating the heat from these areas. Depending on the amount of heat generated by the power semiconductor, such an arrangement also requires that large areas of the printed circuit are provided as cooling surfaces. These cooling surfaces take up a relatively large space.

By means of through-hole connections, several so-called layers of printed circuits, as known, for example, from multilayer printed circuit boards, can be used as cooling surfaces. However, then too, a relatively large space is required so that sufficient heat can be dissipated. Further, in particular in the case of high-frequency switching events affected with the aid of the power semiconductor the large conductive areas of the printed circuit may act as antennas, as a result of which undesired interference effects may occur. These interference effects particularly cause an inadmissible electromagnetic radiation. In order to avoid interferences caused by EMC radiation (EMC=electromagnetic compatibility), the conduction paths between individual components should be as short as possible. Especially in the case of switching mode power supplies having power semiconductors operated at high switching frequencies an electromagnetic radiation is radiated over long or large-area electrical interconnection conductors and this radiation is outside the acceptable ranges of electromagnetic radiation.

From documents WO 01/20955 A1, JP 2002-222720A, U.S. Pat. No. 6,366,486 B1 and JP 2000-299524A, arrangements for dissipating the heat generated by power semiconductor components that are arranged on printed circuits are known.

SUMMARY

It is an object to specify an arrangement and a method in which a power semiconductor is cooled in a simple manner.

In a method and arrangement for cooling a power semiconductor, at least a part of a power loss generated in the power semiconductor as heat is transferred via an electrically and thermally conductive connection between at least one electrical terminal of the power semiconductor and an electrical terminal of a passive electrical component. At least part of the heat transferred to the passive electrical component is dissipated with a cooling element thermally connected to the passive electrical component or to the electrically and thermally conductive connection.

DESCRIPTION OF THE PREFERRED EMBODIMENT

Figure 1:
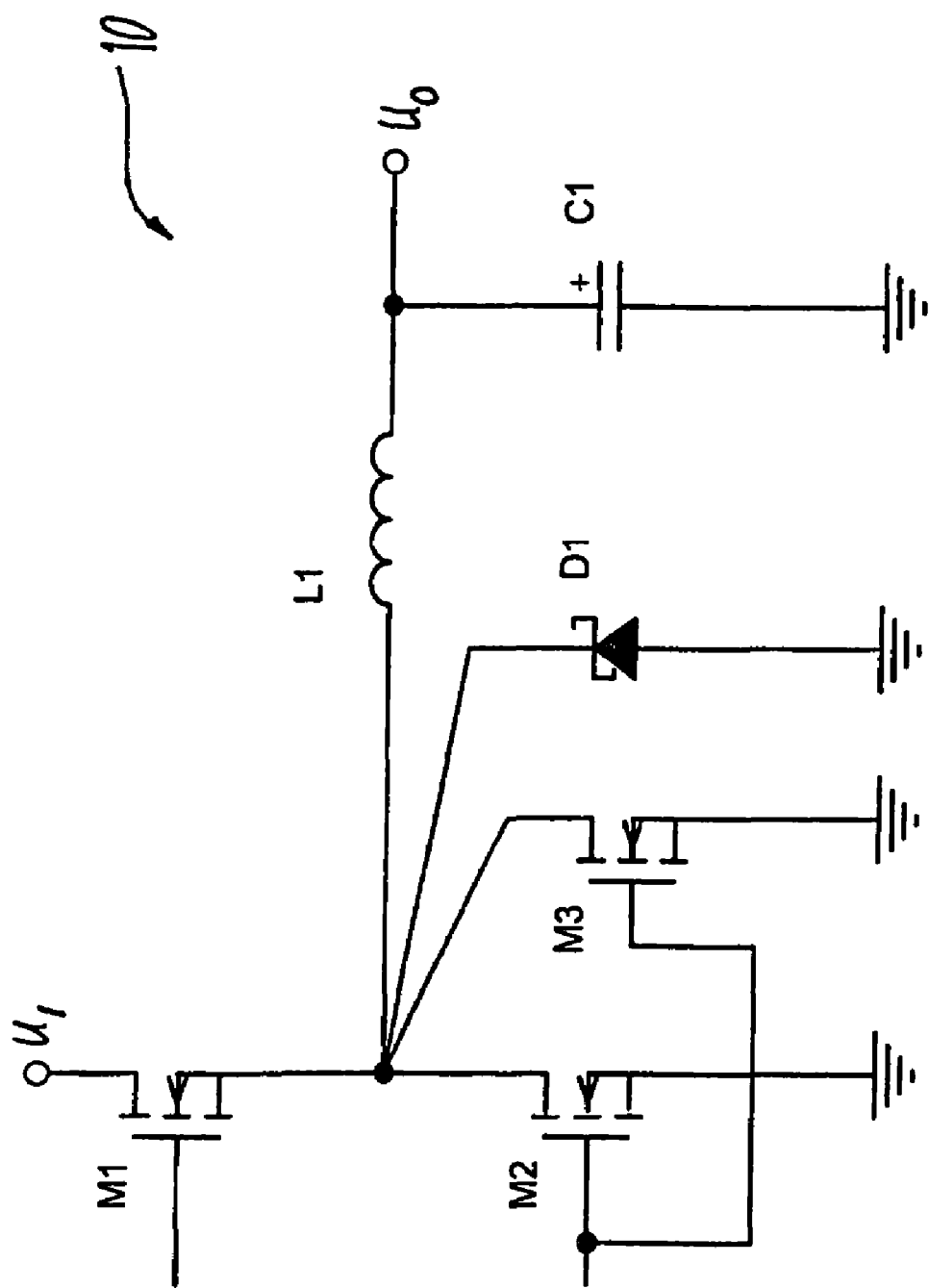
FIG. 1 is a circuit diagram of a direct current converter.

For the purposes of promoting an understanding of the principles of the invention, reference will now be made to the preferred embodiment illustrated in the drawings and specific language will be used to describe the same. It will nevertheless be understood that no limitation of the scope of the invention is thereby intended, such alterations and further modifications in the illustrated device, and/or method, and such further applications of the principles of the invention as illustrated therein being contemplated as would normally occur now or in the future to one skilled in the art to which the invention relates.

By means of an arrangement for cooling a power semiconductor provided herein, the dissipation heat generated by the power semiconductor can be dissipated in a simple manner via the electrical connection to the passive component and from there with the aid of the cooling element. Due to the typical structural forms of passive components, it is relatively easily possible to mount a cooling element on a passive component, such as an inductor. In particular in the case of power semiconductors having a relatively small structural form, such as surface mount power semiconductors, the mounting of cooling elements on the surface mount housing of the power semiconductor is only possible at a relatively high expense.

A second aspect of the preferred embodiment relates to a method for cooling a power semiconductor in which at least part of the power loss generated in the power semiconductor is transferred as heat via a thermally and electrically conductive connection between at least an electrical terminal of the power semiconductor and an electrical terminal of a passive component. Via the thermally and electrically conductive connection a thermal connection between the power semiconductor and the passive component which forms a heat sink is established. At least part of the heat transferred to the passive component is dissipated with the aid of the cooling element that is thermally connected to the passive component. The passive component is preferably an inductor, a capacitor, or an ohmic resistor.

What is achieved by such a method according to the preferred embodiment is that the power semiconductor can be cooled in a simple manner without a cooling element having to be directly mounted on the power semiconductor. As a result, it is also possible to provide relatively short electrically conductive connections between the power semiconductor and the passive component, which will cause no, or only relatively little, EMC interferences. The thermally and electrically conductive connection is preferably established by means of at least one circuit board conductor of a printed circuit. The passive component itself substantially does not generate heat. At least no additional cooling element is required for dissipating the heat generated by the passive component itself.

In FIG. 1, a circuit diagram 10 of a direct current converter is illustrated, which has no potential isolation between the input voltage $U_I$ and the output voltage $U_O$. The voltages $U_I$ and $U_O$ each refer to a common ground potential. In general, direct current converters are also referred to as DC-DC converters. With the aid of MOS field-effect transistors M1, M2, M3 which are activated by means of a control unit (not illustrated), a square-wave alternating voltage is generated from the direct-current input voltage $U_I$ with the aid of switching events. The diode D1 is a Zener diode and serves to limit the output voltage $U_O$. With the aid of the downstream L-C element, implemented in the form of an inductor L1 and a capacitor C1, the square-wave voltage generated with the aid of the transistors M1, M2, M3 is smoothed and output as a direct-current voltage $U_O$. The circuit arrangement according to FIG. 1 is a so-called step-down converter for reducing the input voltage $U_I$ to the output voltage $U_O$. DC-DC converters of this type are also referred to as forward converters.

In each of the switching states of the transistors M1, M2 and M3 for generating the square-wave voltage, a current can flow through a load resistor connected between the output voltage $U_O$ and the ground potential. With the aid of the inductor L1 and the capacitor C1 a low pass for averaging the square-wave voltage is implemented. During the turn-on phase of the transistor M1, the transistors M2 and M3 are blocked so that the inductor is charged. In the blocking phase of the transistor M1, the transistors M2 and M3 are conductive so that the inductor can then be discharged with the aid of the transistors M2 and M3. The period of time during which the transistors M2 and M3 are conductive can be shorter than the blocking phase of the transistor M1. Assuming that the current through the inductor L1 does not become zero, the output voltage $U_O$ is given by the equation $$U_o = \left(\frac{T_{on}}{T}\right) \cdot U_I$$

wherein $T_{on}$ is the duration of the conductive phase of the transistor M1, and T is the duration of the switching period. Further, the output voltage $U_O$ can be varied by varying the duration of the switching period.

Alternatively, for example an alternating voltage of 50 Hz can be used as an input voltage $U_I$, which is converted into a periodic pulse train of high frequency of up to several 100 KHz with the aid of the transistor arrangement M1, M2 and M3. As a result of the averaging with the aid of the low pass formed by the inductor L1 and the capacitor C1, a DC voltage is generated from this pulse train, the amount of which can be controlled and adjusted by setting the pulse width.

As an alternative to the forward converter for reducing the input voltage $U_I$ to the output voltage $U_O$, illustrated with reference to the circuit diagram according to FIG. 1, circuit arrangements for generating a higher output voltage from a lower input voltage are known. Circuit arrangements of this type are, for example, known as reverse converters. Due to the small structural size and for reducing the production costs, the transistors M1, M2 and M3 are in particular implemented as surface mount components. However, due to the usually small dimensions of such surface mount components the heat generated in these components as a result of power loss can only be dissipated in a relatively difficult way with the aid of complex cooling arrangements, as a result whereof the surface mount components are often not cooled with the aid of additional cooling elements. Owing to the relatively small structural height of the surface mount components, there is further the problem that the heat can only be dissipated from the surface mount components relatively poorly, since the flow of air around these surface mount components is partly impeded by components that are arranged around the surface mount components on a printed circuit and have a greater structural height. This is why the surface mount components often cannot be operated up to their actual current carrying capacity and have to be oversized in order to prevent overheating of these surface mount components.

In the present preferred embodiment, the surface mount components transfer at least part of the heat generated in the surface mount component via their electrical terminals to a conductor connected to the electrical terminal of the surface mount component, for example a copper conductor of a printed circuit. Via this electrical conductor, at least part of the heat is passed and transferred to the inductor L1 which is electrically connected to the surface mount component. The structural height of the inductor L1 is in general greater than that of a surface mount component and generally has a relatively large and smooth surface. The surface can, for example, be made of a metal, in particular a ferrite. According to the preferred embodiment at least a part of the surface of the inductor L1 is thermally connected to a cooling element. With the aid of the cooling element a heat sink is generated at the inductor L1, by which the components M1, M2, M3, D1, C1 electrically connected to the inductor L1 are cooled by conducting heat to this heat sink via the electrical connection between these elements M1, M2, M3, D1, C1 and the inductor L1.

As already explained, in particular the transistors M1, M2, M3 implemented as power semiconductors generate a great amount of heat due to their power loss, which amount of heat, as already described, is conducted to the inductor L1 and is dissipated thereat via the cooling element connected to the inductor L1. Such a cooling element can be a heat sink made of aluminum, in particular an aluminum extruded section, which is subjected to forced ventilation. Alternatively, an active cooling element, in particular a water cooling or a Peltier cooling element, can be used for cooling the inductor L1. Alternatively or additionally, the capacitor C1, an ohmic resistor (not illustrated) and/or further passive components which are electrically and thermally conductively connected to power semiconductors M1, M2, M3, D1, may be provided with a cooling body, as a result whereof this passive component then has a heat sink for dissipating the amount of heat generated in this power semiconductor M1, M2, M3, D1 as a result of its power loss.

Figure 2:
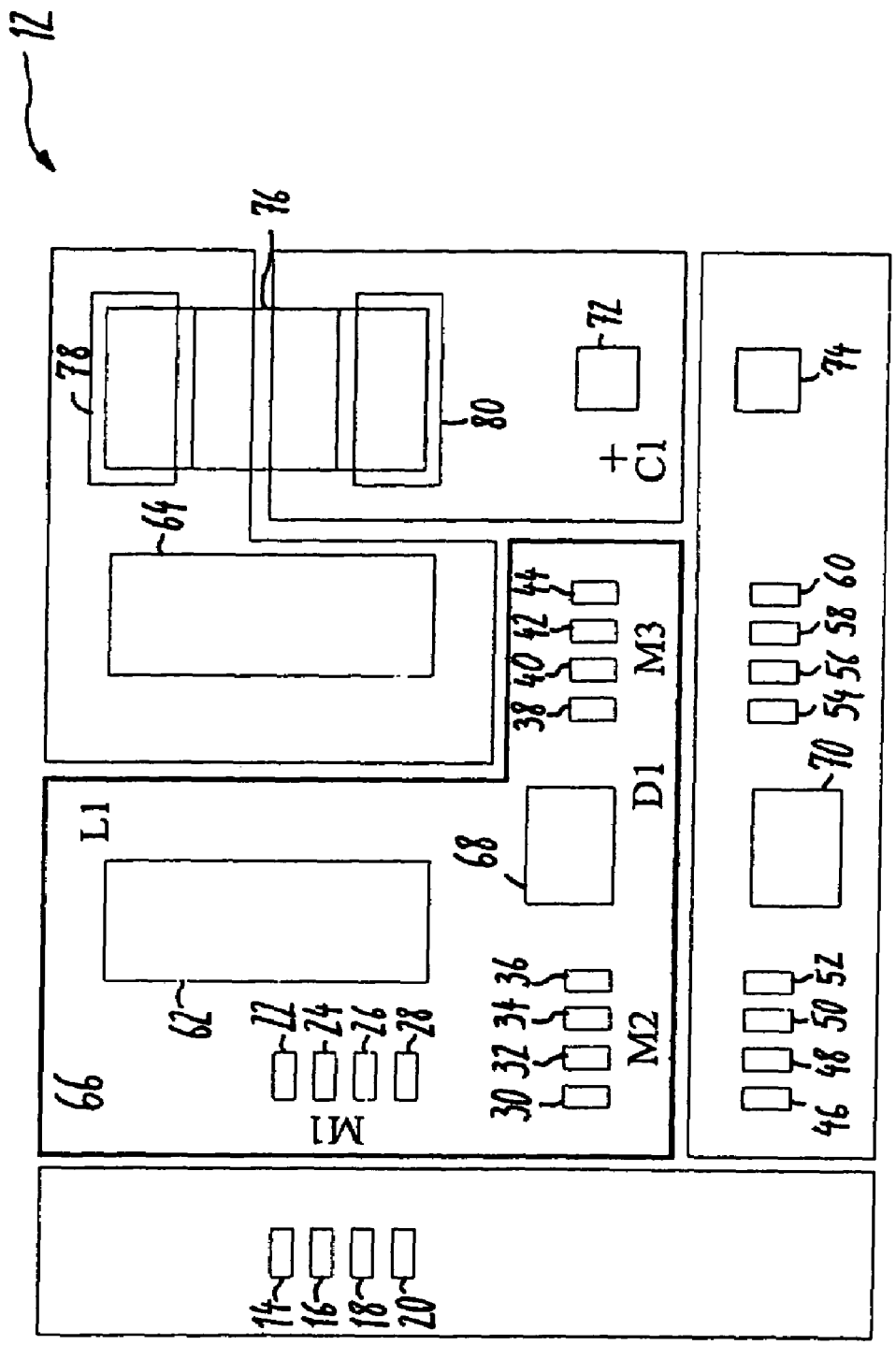
FIG. 2 shows the layout of a printed circuit for implementing the direct current converter according to FIG. 1.

In FIG. 2, a detail of a printed circuit board having a printed circuit 12 is shown, in which the board pattern is made of a copper-clad plate of insulating material. Preferably, the spaces between the circuit board conductors are etched out with the aid of a suitable process so that only the circuit board conductors remain on the plate of insulating material. The outlines of the circuit board conductors and the connecting pads provided on these circuit board conductors for the components M1, M2, D1, M3, L1 implemented as surface mount components are also illustrated in FIG. 2. These connecting pads are generated by printing the entire circuit board surface with a solder resist, the surfaces of the connecting pads themselves not being covered with the solder resist. Subsequently, the connecting pads are usually tin-coated in order to quickly provide a high-quality connection to the component terminals in the later assembly of the components M1, M2, M3.

For connecting the transistor M1, the connecting pads 14 through 28 are provided, for connecting the transistor M2 the connecting pads 30 through 36 as well as 46 through 52 are provided and for connecting the transistor M3 the connecting pads 38 through 44 as well as 54 through 60 are provided. The inductor L1 is connected to the connecting pads 62, 64 of the printed circuit 12. The diode D1 is connected to the connecting pads 68, 70 and the capacitor C1 is connected to the connecting pads 72, 74. Further, a fuse link 76 is provided which is connected to the connecting pads 78, 80 of the printed circuit 12. The connecting pads 22 through 44 of the transistors M1, M2, M3 are electrically conductively connected to the connecting pad 62 of the inductor L1 via the copper-clad surface 66 acting as an electrical conductor and as a thermal conductor.

The distances between the connecting pads 22 through 44 and 62 are relatively short, so that a great amount of heat can relatively simply be transferred from the connecting pads 22 through 44 to the connecting pad 62. The amount of heat that can be transferred with the aid of the circuit board conductor 66 is substantially dependent on the cross-section of the connection between the pad 62 and the respective pads 22 through 44, in particular the distance and the thickness of the copper layer being decisive for the amount of heat that can be transferred. For increasing the amount of heat that can be transferred, the pads 22 through 44, 62 can be through-contacted to another parallel copper layer, as a result whereof via this parallel copper layer, heat can likewise be transferred from the connecting pads 22 through 44 to the connecting pad 62 and thus to the heat sink of the inductor L1. As already mentioned, the heat sink of the inductor L1 is established or at least enlarged by the cooling body connected to the inductor L1. For dissipating the heat generated by the power loss of the inductor L1 usually no cooling body is required.

Figure 3:
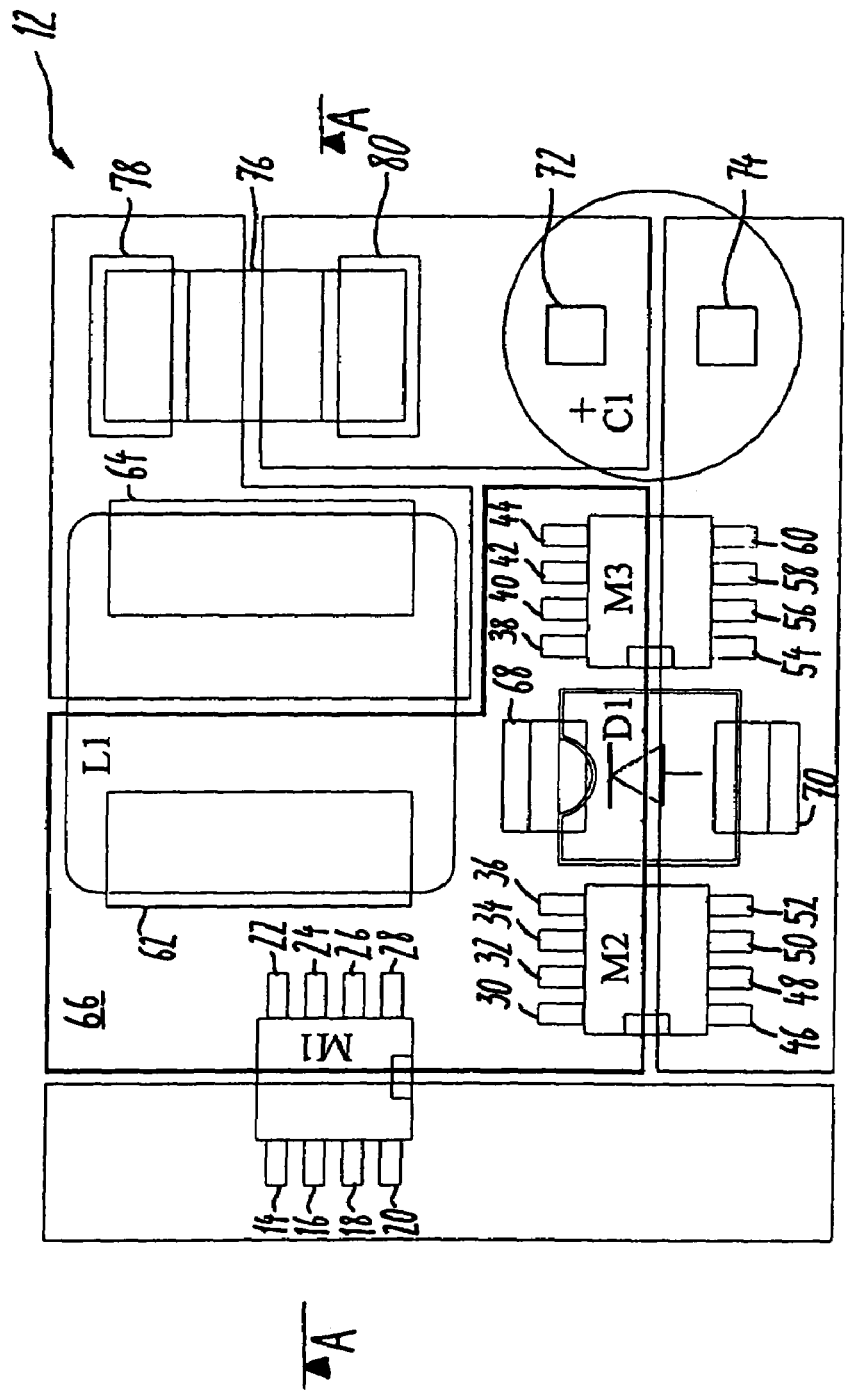
FIG. 3 shows the printed circuit according to FIG. 2 including outlines of components connected to the printed circuit.

In FIG. 3, the printed circuit 12 according to FIG. 2 is illustrated, the outlines of the components M1, M2, M3, D1, L1, C1 as well as the fuse link 76 being illustrated.

Figure 4:
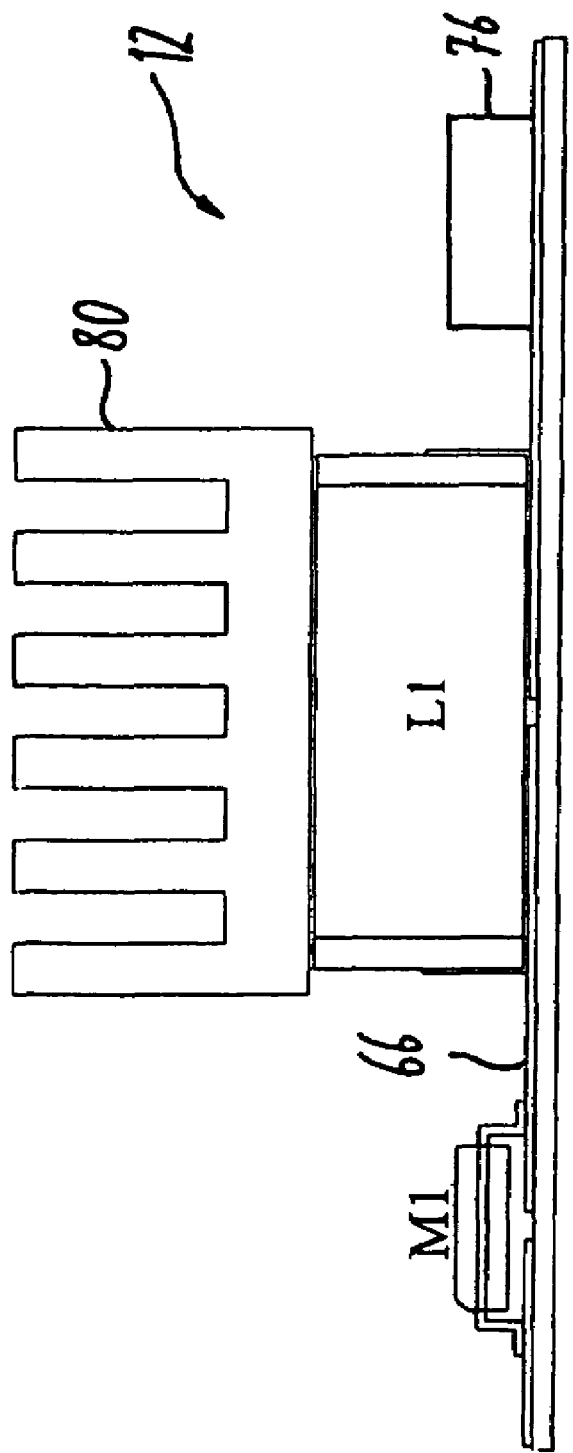
FIG. 4 is a side view of the printed circuit according to FIG. 3 taken along line A-A.

In FIG. 4, a side view of the printed circuit 12 with the outlines of the components M1, L1 as well as of the fuse link 76 taken along the line A-A according to FIG. 3 is illustrated. In contrast to FIG. 3, on the surface of the plane upper side of the inductor L1 a cooling body 80 is mounted. This cooling body is an aluminum extruded profile, the cooling ribs of which are provided with several transverse slots running transversely to the cooling ribs, as a result whereof the cooling body 80 has upwardly projecting cooling elements. Preferably, a thermally conductive leveling layer, such as a thermal compound is provided, in order to better transfer heat from the inductor L1 to the cooling body 80.

Further, the cooling body 80 can be subjected to a forced ventilation with the aid of a fan. Further, alternatively or additionally to the cooling body 80, other cooling elements such as water-cooled cooling elements, Peltier elements or semiconductor cooling elements can be used.

The passive electrical component may be arranged near the power semiconductor at a distance in a range of 0 mm to 20 mm.

The preferred embodiment can advantageously be used in DC voltage converters in switching mode power supplies, in particular in step-up converters, inverters and step-down converters. Such step-up converters are also referred to as reverse converters, and step-down converters are also referred to as forward converters. However, with the aid of the preferred embodiment other power semiconductors which are connected to an inductor can be cooled as well. Further, the preferred embodiment is not restricted to power semiconductors in the form of surface mount devices (SMD) but can be used for any given structural form of power semiconductors.

If several DC voltage converters are arranged side by side, the inductors can be arranged next to one another such that a common cooling body contacts a part of each surface of every inductor. This is particularly advantageous if the inductors have the same structural form.

A passive electrical component in the sense of the preferred embodiment is an electronic component, the output of which cannot be controlled and which is not suited for signal amplification as is an active component. Such passive electrical components are, for example, resistors, inductors as well as capacitors.

While the invention has been illustrated and described in detail in the drawings in the above description, the same is to be considered as illustrative and not restrictive in character, it being understood that only the preferred embodiment has been shown and described and that all changes and modifications that come within the scope of the invention are desired to be protected.

I claim as my invention:

1. An arrangement for cooling a power semiconductor, comprising:
    at least one power semiconductor and at least one passive electrical component;
    at least one electrical terminal of the power semiconductor being thermally connected to an electrical terminal of the passive electrical component via an electrical connection; and
    a cooling element thermally directly connected to at least a part of a surface of the passive electrical component but only indirectly thermally connected to said power semiconductor through said electrical connection.

2. The arrangement according to claim 1 wherein the electrically conductive connection between the electrical terminal of the power semiconductor and the electrical terminal of the passive electrical component is established with a circuit board conductor of a printed circuit.

3. The arrangement according to claim 2 wherein the power semiconductor and the passive electrical component are directly arranged on the printed circuit for establishing at least the electrical connection between the power semiconductor and the passive electrical component.

4. The arrangement according to claim 2 wherein the circuit board conductor electrically connects the power semiconductor to the passive electrical component as well as thermally connects the power semiconductor to the passive electrical component.

5. The arrangement according to claim 1 wherein the passive electrical component comprises an inductor, a capacitor, or an ohmic resistor.

6. The arrangement according to claim 1 wherein said cooling element is designed to dissipate heat of both the power semiconductor and the passive component If the passive component is generating heat.

7. The arrangement according to claim 1 wherein an electric power loss of the power semiconductor is higher than an electric power loss of the passive electrical component.

8. The arrangement according to claim 1 wherein the cooling element comprises a cooling body formed of an aluminum extruded section.

9. The arrangement according to claim 1 wherein the cooling element comprises a Peltier element or a semiconductor cooling element.

10. The arrangement according to claim 1 wherein between a part of the surface of the passive electrical component and the cooling element a thermally conductive leveling layer is arranged as said direct thermal connection.

11. The arrangement according to claim 1 wherein at least the power semiconductor is a component which is mounted on a surface of a circuit board.

12. The arrangement according to claim 1 wherein the electrical connection is established with aid of a low-ohmic circuit board conductor.

13. The arrangement according to claim 1 wherein the passive electrical component is arranged near the power semiconductor at a distance in a range of 0 mm to 20 mm.

14. The arrangement according to claim 1 wherein the cooling element is arranged on an upper side of the passive electrical component relative to a mounting plane of the passive electrical component.

15. The arrangement according to claim 1 wherein the passive electrical component has at least a surface area with a relatively high electrical conductivity.

16. The arrangement according to claim 1 wherein the arrangement contains at least a second passive electrical component, the cooling element being connected to at least said part of the surface of the passive electrical component as well as to at least a part of the a surface of the second passive electrical component.

17. A method for cooling a power semiconductor, comprising the steps of:
transferring at least a part of a power loss generated in the power semiconductor as heat via an electrically and thermally conductive connection between at least one electrical terminal of the power semiconductor and an electrical terminal of a passive electrical component; and
dissipating at least part of the heat transferred to the passive electrical component with a cooling element directly thermally connected to the passive electrical component but only indirectly thermally connected to said power semiconductor through said electrically and thermally conductive connection.

18. An arrangement for cooling a power semiconductor, comprising:
at least one power semiconductor and at least one inductor arranged within 20 mm or less of the power semiconductor;
at least one electrical terminal of the power semiconductor being electrically and thermally connected to an electrical terminal of the inductor via an electrical connection; and
a cooling element directly thermally connected to the inductor but only indirectly thermally connected to said power semiconductor through said electrical connection.

19. A method for cooling a power semiconductor, comprising the steps of:
transferring at least a part of a power loss generated in the power semiconductor as heat via an electrically and thermally conductive connection between at least one electrical terminal of the power semiconductor and an electrical terminal of an inductor, the inductor being arranged within 20 mm or less of the power semiconductor; and
dissipating at least part of the heat transferred to the inductor with a cooling element directly thermally connected to the inductor but only indirectly thermally connected to said power semiconductor through said electricall and thermally conductive connection.

* * * * *